United States Patent [19]
Beng et al.

[11] Patent Number: 5,466,888
[45] Date of Patent: Nov. 14, 1995

[54] PACKAGED SEMICONDUCTOR DEVICE HAVING STRESS ABSORBING FILM

[75] Inventors: Lim T. Beng; Chai T. Chong, both of Singapore, Singapore; Masazumi Amagai, Ushiku, Japan; Ichiro Anjoh, Koganei, Japan; Junichi Arita, Musashino, Japan; Kunihiro Tsubosaki, Hino, Japan; Masahiro Ichitani, Kodaira, Japan; Darvin Edwards, Dallas, Tex.

[73] Assignees: Hitachi, Ltd., Tokyo, Japan; Texas Instruments, Inc., Dallas, Tex.

[21] Appl. No.: 384,836

[22] Filed: Feb. 7, 1995

Related U.S. Application Data

[63] Continuation of Ser. No. 198,389, Feb. 18, 1994, Pat. No. 5,406,028, which is a continuation of Ser. No. 855,842, Mar. 20, 1992, abandoned.

[30] Foreign Application Priority Data

| | | | |
|---|---|---|---|
| Mar. 20, 1991 | [JP] | Japan | 3-057476 |
| Mar. 20, 1991 | [JP] | Japan | 3-057477 |
| Mar. 20, 1991 | [JP] | Japan | 3-081451 |

[51] Int. Cl.⁶ .................................................. H01L 23/28
[52] U.S. Cl. .......................... 174/52.2; 257/692; 257/696; 257/700; 257/787
[58] Field of Search .................... 174/52.2, 52.4; 257/678, 690–694, 696, 700–702, 787, 792–794, 791, 695, 796; 437/211–213, 215, 219

[56] References Cited

U.S. PATENT DOCUMENTS 5,155,578  10/1992  Lim et al. ................................ 439/68

*Primary Examiner*—Bot L. Ledynh
*Attorney, Agent, or Firm*—Antonelli, Terry, Stout & Kraus

[57] ABSTRACT

A packaged semiconductor device has a semiconductor chip and leads formed over the chip with an electrically insulating film interposed therebetween and a packaging material for sealing the chip and the inner lead portions of the leads. The electrically insulating film has such an area as to provide a peripheral portion not covered by parts of the inner lead portions of the leads for strengthening adherence of the electrically insulating film to the packaging material and to the chip. The electrically insulating film has a thickness substantially in a range from 80 μm to 200 μm for absorbing stress which may be produced in the packaged semiconductor device when subjected to variations of the ambient temperature. A stress absorption film may be formed between the electrically insulating film and the semiconductor chip for absorbing stress which may be produced in the packaged semiconductor device when subjected to variations of the ambient temperature.

6 Claims, 7 Drawing Sheets

PASSIVATION FILM

PACKAGED SEMICONDUCTOR DEVICE HAVING STRESS ABSORBING FILM

This is a continuation of application Ser. No. 198,389, filed Feb. 18, 1994, now U.S. Pat. No. 5,406,028; which is a continuation of application Ser. No. 855,842 filed Mar. 20, 1992, now abandoned.

BACKGROUND OF THE INVENTION

This invention relates to a semiconductor device. More particularly, it relates to technique which will be effective when applied to a package having an LOC (Lead On Chip) structure of a large scale integrated circuit.

To protect a semiconductor chip, it has been customary to mold a semiconductor chip by a resin and to seal it. Various methods have been employed to position leads on a semiconductor chip and to fit them before this sealing is carried out.

When a lead frame equipped with tabs at the center is used, for example, the semiconductor chip is fitted to the tabs before it is sealed. As the prior art technique of this kind, a method which connects electrode pads near and around the semiconductor chip to corresponding inner leads by bonding wires is known.

The common problem with the semiconductor package according to the prior art is that cracks develop along parting lines of molds as the outlet of leads of a metallic lead frame.

Another problem is that an invasion path of contaminant sources in an environment from outside into the semiconductor chip along the metallic leads is relatively short.

Still another problem is that the bonding wires necessary for connecting the inner leads to the electrode pads of the semiconductor chip cannot be crossed mutually.

In a semiconductor device in which a plurality of inner lead portions of leads are bonded onto a circuit formation surface of a semiconductor chip by an adhesive while interposing an electrically insulating tape or film, the inner lead portions and the semiconductor chip are electrically connected by bonding wires and the semiconductor chip is sealed by a mold resin, a semiconductor device having common inner lead portions (bus bar inner leads) in the proximity of the center line of the circuit formation surface of the semiconductor chip in the longitudinal direction has been proposed in order to eliminate the cross-over problem described above (e.g. JP-A-2-246125 laid-open on Oct. 1, 1990).

SUMMARY OF THE INVENTION

As a result of experiments and studies, however, the inventors of the present invention have found out that the semiconductor devices of the prior art are not yet free from the following problems. As shown in FIG. 1 of the accompanying drawings, a plurality of inner lead portions are formed on the circuit formation surface (main surface) of the semiconductor chip 1 are bonded to the semiconductor chip 1 by an adhesive while sandwiching an insulating film 4 between them. It has been found, however, that depending on the level of accuracy of work on the basis of the design of this insulating tape 4, the stress that occurs during temperature cycles so functions as to define a gap on the boundary surface between the insulating tape 4 and the common inner lead portions $3A_2$ and the sealing resin as shown in FIG. 2 if the insulating tape 4 has a dimension such that the insulating tape 4 is equal to the length of the range in which it is affected by the thermocompression bonding force acting on the common inner lead portions $3A_2$ and on the semiconductor chip 1 or if the insulating film 4 is positioned more inward than this range. Since the stress acts concentratedly on the corners of the common inner lead portions $3A_2$ in this case, cracks CK develop in the sealing resin 2A and voids BD (FIG. 1) also develop in a small space between the inner lead portions $3A_1$ and the semiconductor chip 1. Thus, reliability of the semiconductor device gets deteriorated. This fact has been confirmed by the observation of the semiconductor device with SAT (Scanning Acoustic Tomography) or by the observation of the section with eye.

It has also been clarified that if the insulating film 4 has a dimension such that it protrudes beyond the range in which it is affected by the thermocompression bonding force described above and is positioned more outward than this range as shown in FIG. 3, the voids BD occur at the portion of the insulating tape 4 not affected by the thermocompression bonding force, so that reliability of the semiconductor device drops, as well.

In the conventional semiconductor device, a plurality of inner lead portions are bonded to the circuit formation surface (main surface) of the semiconductor chip by the adhesive through the insulating film 4, but if the thickness of this insulating film 4 is too great, the stress resulting from the temperature cycle becomes great and the cracks develop in the sealing resin. If the thickness of the insulating film 4 is too small, on the other hand, the electrostatic capacity between the chip and the leads becomes too great. Moreover, it has been found that influences of the stress on the semiconductor chip from outside become great and in the worst case, the cracks develop in the semiconductor chip.

In the conventional packaged semiconductor device having the LOC structure described above, a plurality of inner lead portions of leads are bonded to the circuit formation surface (main surface) of the semiconductor chip as described above by the adhesive through the insulating film 4 as described above. It has also been clarified that the stress resulting from the difference of heat expansion coefficients between the insulating film and silicon of the semiconductor chip damages the main surface of the semiconductor chip and in the worst case, the cracks develop in the semiconductor chip.

It is therefore an object of the present invention to provide technique capable of improving reliability of a semiconductor device.

It is another object of the present invention to provide technique capable of obtaining an appropriate electrostatic capacitance between a chip and leads.

It is another object of the present invention to provide technique capable of preventing the occurrence of cracks on the surface of a semiconductor chip.

It is still another object of the present invention to provide technique capable of preventing damage to a circuit by a filler contained in a sealing resin.

It is a further object of the present invention to provide technique capable of shielding alpha-rays from outside (or capable of preventing a soft error).

According to one aspect of the present invention, a packaged semiconductor device has a semiconductor chip and leads formed over the chip with an electrically insulating film interposed therebetween and a packaging material for sealing the chip and the inner lead portions of the leads. The electrically insulating film has such an area as to provide a peripheral portion not covered by parts of the inner lead portions of the leads for strengthening adherence of the electrically insulating film to the packaging material and to the chip. The electrically insulating film has a thickness substantially in a range from 80 μm to 200 μm for absorbing stress which may be produced in the packaged semiconductor device when subjected to variations of the ambient temperature.

According to another aspect of the present invention, a packaged semiconductor device in the above-mentioned structure further has a stress absorption film formed between the electrically insulating film and the semiconductor chip, for absorbing stress which may be produced in the packaged semiconductor device when subjected to variations of the ambient temperature.

DESCRIPTION OF THE PREFERRED EMBODIMENTS

Figure 1:
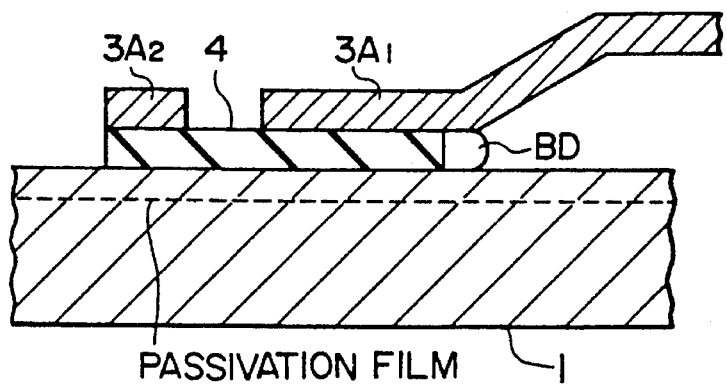
FIG. 1 is a sectional view useful for explaining the problems with a conventional semiconductor device with voids.
Figure 2:
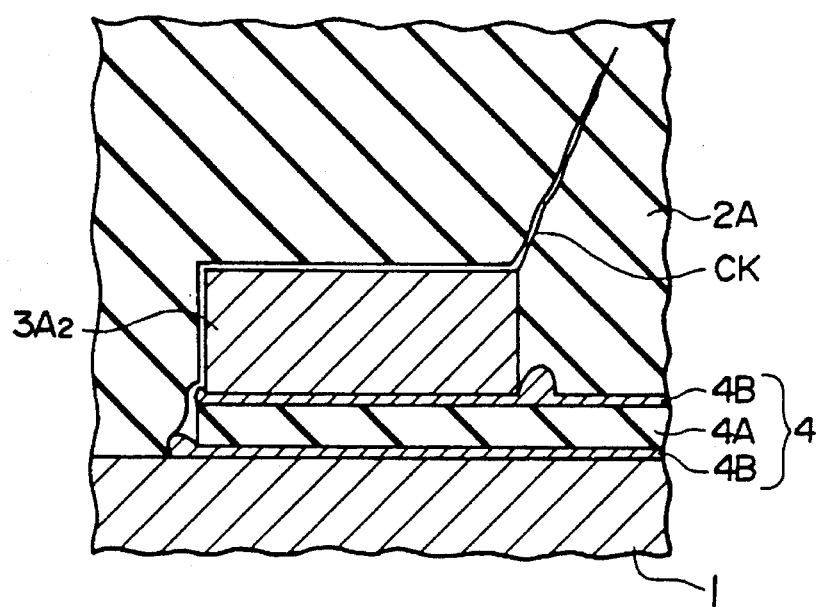
FIG. 2 is also a sectional view useful for explaining the problems with the conventional semiconductor device with cracks.
Figure 3:
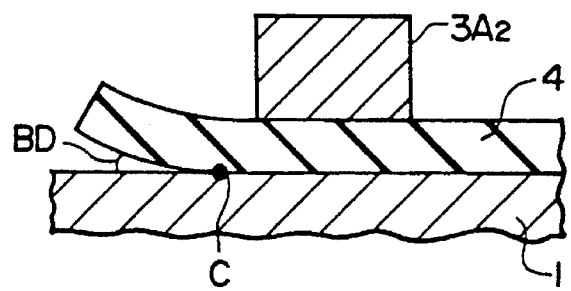
FIG. 3 is also a sectional view useful for explaining the problems with the conventional semiconductor device with voids.

Incidentally, like reference numerals will be used throughout all the drawings to identify like constituents having the same function, and repetition of explanation of such constituents will be omitted.

Figure 4:
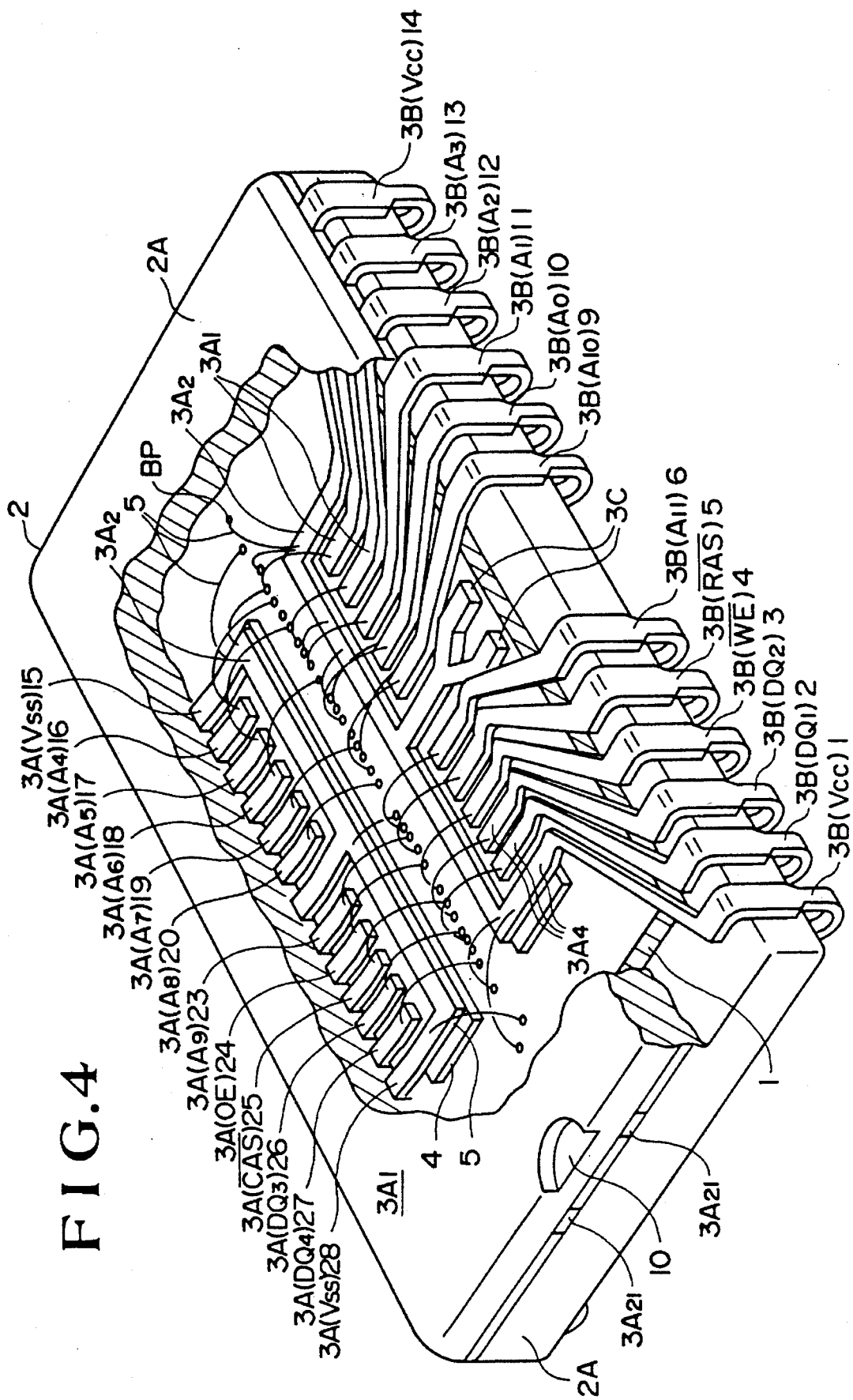
FIG. 4 is a partial sectional perspective view of a packaged semiconductor device including a DRAM according to an embodiment of the present invention.
Figure 5:
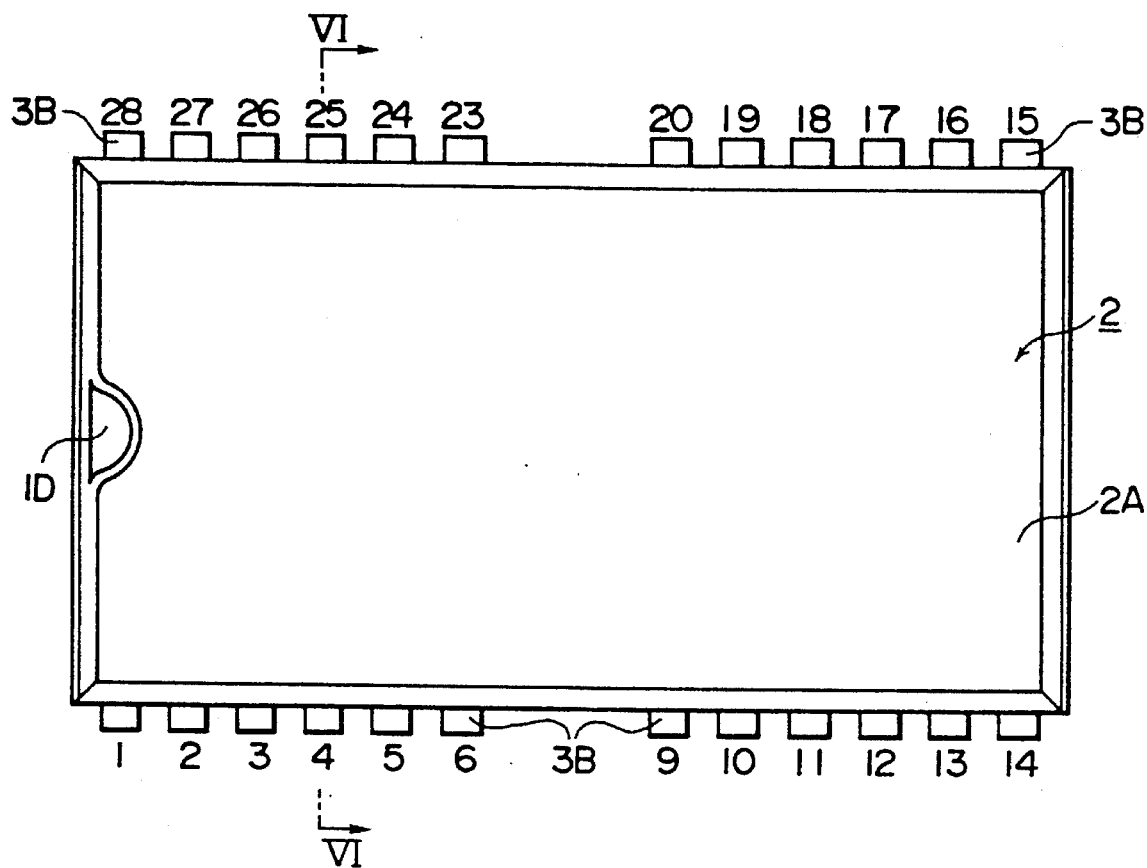
FIG. 5 is a plan view of the packaged semiconductor device shown in FIG. 4.
Figure 6:
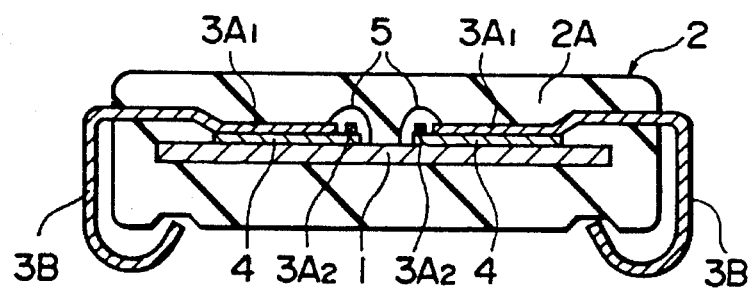
FIG. 6 is a sectional view taken along a line VI—VI in FIG. 4.
Figure 7:
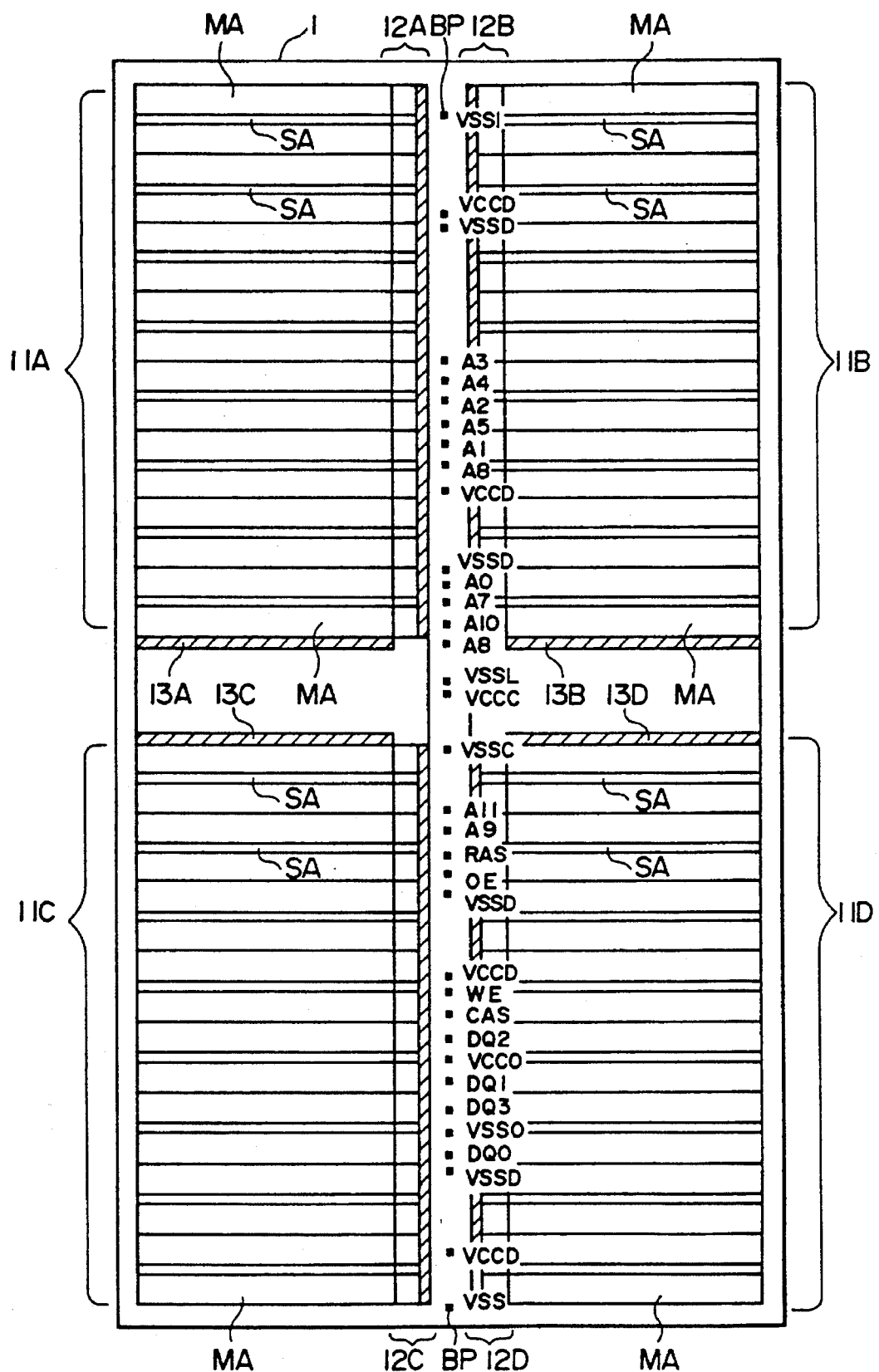
FIG. 7 is a layout diagram of a DRAM chip according to an embodiment of the present invention.

A resin mold semiconductor device (a packaged semiconductor device) sealing therein a chip containing a DRAM according to the present invention is shown in FIG. 4 (partial sectional perspective view), FIG. 5 (plan view) and FIG. 6 (sectional view taken along line VI—VI of FIG. 5). As shown in FIGS. 4, 5 and 6, a DRAM chip (semiconductor chip) 1 is substantially square and is sealed by an SOJ (Small Out-line J-bend) type resin molding package 2. The DRAM chip 1 has a large capacity of 16 [Mbit]×1 [bit] and has a rectangular plane of 15.58 [mm]×8.15 [mm]. This DRAM chip 1 is sealed by a 400 [mil]-wide resin molding package 2. The device layout and bonding pads BP of the DRAM of this embodiment have the arrangement structure shown in FIG. 7 (layout plan view). Memory cell arrays MA are disposed substantially throughout the full surface of the chip 1. Though not particularly limited, the DRAM of this embodiment includes memory cell array blocks 11A to 11D divided into four blocks. In the drawing, two memory cell array blocks 11A and 11B are shown disposed at the upper part of the chip 1 and two memory cell array blocks 11C and 11D, at the lower part. Each of these four divided memory cell array blocks 11A to 11D is further divided into 16 memory cell arrays MA. In other words, the DRAM chip 1 includes 64 memory cell arrays MA in all. One memory cell array MA of these 64 divided memory cell arrays MA has a capacity of 256 [Kbit].

A sense amplifier circuit SA is disposed between each adjacent pair of memory cell arrays MA among the 64 divided memory cell arrays. The sense amplifier SA comprises complementary MOSFETs (CMOSes). Peripheral circuits 13A and 13B each including a column address decoder circuit YDEC are disposed at one of the lower ends of the memory cell array blocks 11A and 11B, respectively. Similarly, peripheral circuits 13C and 13D each including a column address decoder circuit YDEC are disposed at one of the upper ends of the memory cell arrays 11C and 11D, respectively.

Peripheral circuits 12A to 12D and external terminals (bonding pads) BP are disposed between the memory cell array blocks 11A and 11B and between the memory cell array blocks 11C and 11D, respectively.

The peripheral circuits 12A–12D are mainly a main amplification circuit, an output buffer circuit, a substrate potential generation circuit ($V_{BB}$: generator circuit), a power supply circuit, and so forth.

The peripheral circuits 13A–13D are mainly a row address strobe (RE) circuit, a write enable (W) circuit, a data input buffer circuit, a $V_{cc}$ limiter circuit, a row address driver circuit (logic stage), a row redundancy circuit, a row address buffer circuit, a column address strobe (CE) circuit, a test circuit, a limiter circuit for memory array, a column address driver circuit, a column address buffer circuit, a column address driver circuit (drive stage), a row address driver circuit (drive stage), a memory array block selection signal circuit (drive stage), and so forth.

The resin packaged semiconductor device 2 comprises an LOC structure and the inner lead portions 3A are extended near to the substantial center line portion of the main surface of the DRAM chip 1. Therefore, the external terminals BP described above are arranged in line on the substantial center line on the main surface of the chip 1, that is, from the upper end side to the lower end side of the center line portion of the chip 1 inside the region defined by the memory cell array locks 11A, 11B, 11C and 11D. Each of the external terminals BP is electrically connected to the inner lead portion 3A disposed on the main surface of the chip 1 by a bonding wire 5 (see FIG. 4).

Fundamentally, common inner bars $3A_2$ of a common inner lead portion, to which a reference voltage ($V_{ss}$) and a power supply voltage ($V_{cc}$) are applied, extend substantially at the center on the main surface of the chip 1 in the longitudinal direction of the chip. Therefore, the DRAM chip 1 has a plurality of external terminals BP for the reference voltage ($V_{ss}$) and a plurality of external terminals BP for the power supply voltage ($V_{cc}$) in its extending direction. In other words, the DRAM chip 1 is constituted in such a manner that the reference voltage ($V_{ss}$) and the power supply voltage ($V_{cc}$) can sufficiently be applied thereto, respectively.

The inner lead portion 3A is disposed on the main surface of the chip 1, that is, on the main surface on which the memory cell arrays and the peripheral circuits are disposed. Electrically insulating films 4 are interposed between the chip 1 and the inner lead portion 3A. This insulating film 4 comprises a heat-setting polyimide resin film, for example. (The insulating film will be described elsewhere in further detail.) The insulating film 4 has adhesive layers disposed on an electrically insulating base film on the side opposing the chip 1 and on the side opposing the inner lead portion 3, respectively. A thermoplastic polyether amide imide resin, an epoxy resin or a polyimide resin, for example, is used as the adhesive layer.

The resin packaged semiconductor device shown in the drawing employs the LOC structure wherein the inner lead portions 3A are disposed on the chip. The resin packaged semiconductor device 2 employing the LOC structure can freely extend the inner lead portions 3A without being limited by the shape of the chip 1. Therefore, a chip 1 having a greater size corresponding to this extension of the inner lead portions 3A can be sealed. In other words, the packaged device 1 can keep the sealing size (package size) small even when the size of the DRAM chip 1 is increased on the basis of the greater capacity. For this reason, the packaging density can be improved.

One of the ends of each inner lead portion 3A constitutes a lead integrally with the outer lead portion 3B. A signal to be applied to each outer lead portion 3B is stipulated on the basis of the standard rating and a serial number is put thereto. In FIG. 4, the lead portion at the extreme left on the front side is the first terminal and the lead portion at the extreme right on the front side is the 14th terminal. The lead portion at the extreme right on the rear side is the 15th terminal (with the terminal number being put to the inner lead portion 3A) and the lead portion at the extreme left on the rear side is the 28 th terminal, though it is not shown in the drawing. In other words, this resin sealed package 2 has 24 terminals in all, including the first to sixth terminals, ninth to 14th terminals, 15th to 20th terminals and 23rd to 28th terminals.

The first terminal is a power supply voltage $V_{cc}$ terminal. The power supply voltage $V_{cc}$ is an operation voltage of the circuit and is 5 [V], for example. The second and third terminals are data input signal terminals ($DQ_1$, $DQ_2$), the fourth terminal is a write enable signal terminal ($\overline{WE}$), the fifth terminal is a row address strobe signal terminal (RAS) and the sixth terminal is an address signal terminal ($A_{11}$).

The ninth terminal is an address signal terminal ($A_{10}$), the eleventh is an address signal terminal ($A_0$), the twelfth is an address signal terminal ($A_2$), the thirteenth is an address signal terminal ($A_3$) and the fourteenth, the power supply voltage $V_{cc}$ terminal.

The fifteenth terminal is a reference voltage $V_{ss}$ terminal. The reference voltage $V_{ss}$ is a reference voltage of the circuit and is 0 [V], for example, the sixteenth terminal is an address signal terminal ($A_4$), the seventeenth is an address signal terminal ($A_5$), the eighteenth is an address signal terminal ($A_6$), the nineteenth is an address signal terminal ($A_7$) and the twentieth, an address signal terminal ($A_8$).

The twenty-third terminal is an address signal terminal ($A_g$), the twenty-fourth is an output enable terminal, the twenty-fifth terminal is a column address strobe signal terminal ($\overline{CAS}$), the twenty-sixth terminal is a data output signal terminal ($DQ_3$), the twenty-seventh terminal is a data output signal terminal ($DQ_4$) and the twenty-eighth, the reference voltage $V_{ss}$ terminal.

The other end of each inner lead portion 3A is extended to the center side of the chip 1 in such a manner as to cross the major side of the rectangular shape of the chip 1. The tip of the other end is electrically connected to the bonding pad (external terminal) BP disposed at the center of the chip 1 through a bonding wire 5. A gold (Au) wire is used as the bonding wire 5. A copper (Cu) wire or a coated wire obtained by coating the surface of a metal wire with an insulating resin can also be used as the bonding wire. The bonding wire is bonded by a bonding method using thermocompression bonding in combination with ultrasonic oscillation.

Among the inner lead portions 3A, the inner lead portions ($V_{cc}$) 3A of the first and fourteenth terminals are constituted integrally with a common inner bar $3A_2$ which is extended in the center direction of the chip 1 in parallel with its major side (or with the minor side). (These inner lead portions ($V_{cc}$) 3A constitute a common inner lead or a bus bar inner lead together with the common inner bar $3A_2$.) Similarly, the inner lead portions ($V_{ss}$) 3A of the fifteenth and twenty-eighth terminals are constituted integrally with another common inner bar $3A_2$ which extends in the center direction of the chip 1 in parallel with its major side (or with the minor side). (These inner lead portions ($V_{ss}$) 3A constitute another common inner lead or bus bar inner lead. These common inner bar ($V_{cc}$) $3A_2$ and ($V_{ss}$) $3A_2$ extend in parallel with each other inside the region which is defined by the tips of the other inner lead portions 3A (the inner lead portions $3A_1$ for signal) at their other end portions. The common inner lead bars ($V_{cc}$) $3A_2$, ($V_{ss}$) $3A_2$ are so constituted as to be capable of supplying the power supply voltage $V_{cc}$ and the reference voltage $V_{ss}$ at any position on the main surface of the chip 1, respectively. In other words, this resin packaged semiconductor device is constituted in such a manner as to be capable of easily absorbing the power supply noise and to improve the operation speed of the DRAM chip 1. Incidentally, the common inner bars may be only one and are constituted integrally with at least one lead.

Sealing resin support leads $3A_{21}$ are disposed on the minor side portions of the rectangular shape of the DRAM chip 1 so as to support the resin sealed package itself and to prevent its fall when the leads are cut and shaped.

Dummy leads 3C which are not for taking out the signals are disposed at the center of the major side portions of the rectangular shape of the DRAM chip 1.

The outer leads 3B and the sealing resin support leads $3A_{21}$ are cut off from the lead frame and shaped. The lead frame is made of an Fe—Ni alloy (containing 42 or 50% Ni), Cu, etc., for example.

The chip 1, the bonding wires 5, the inner lead portions 3A, the sealing resin support leads $3A_{21}$ and the dummy leads 3C are sealed by a sealing resin 2A. To reduce the stress, the sealing resin 2A uses an epoxy resin to which a phenolic curing agent, a silicone rubber and a filler are added. The silicone rubber has the function of reducing the elastic modulus of the epoxy resin. The filler comprises spherical silicon dioxide particles and has also the function of reducing the thermal expansion coefficient. An index ID (a slit disposed at the extreme left of FIGS. 4 and 5) is disposed at a predetermined position of the package 2.

Next, the lead frame will be explained in further detail.

Figure 8:
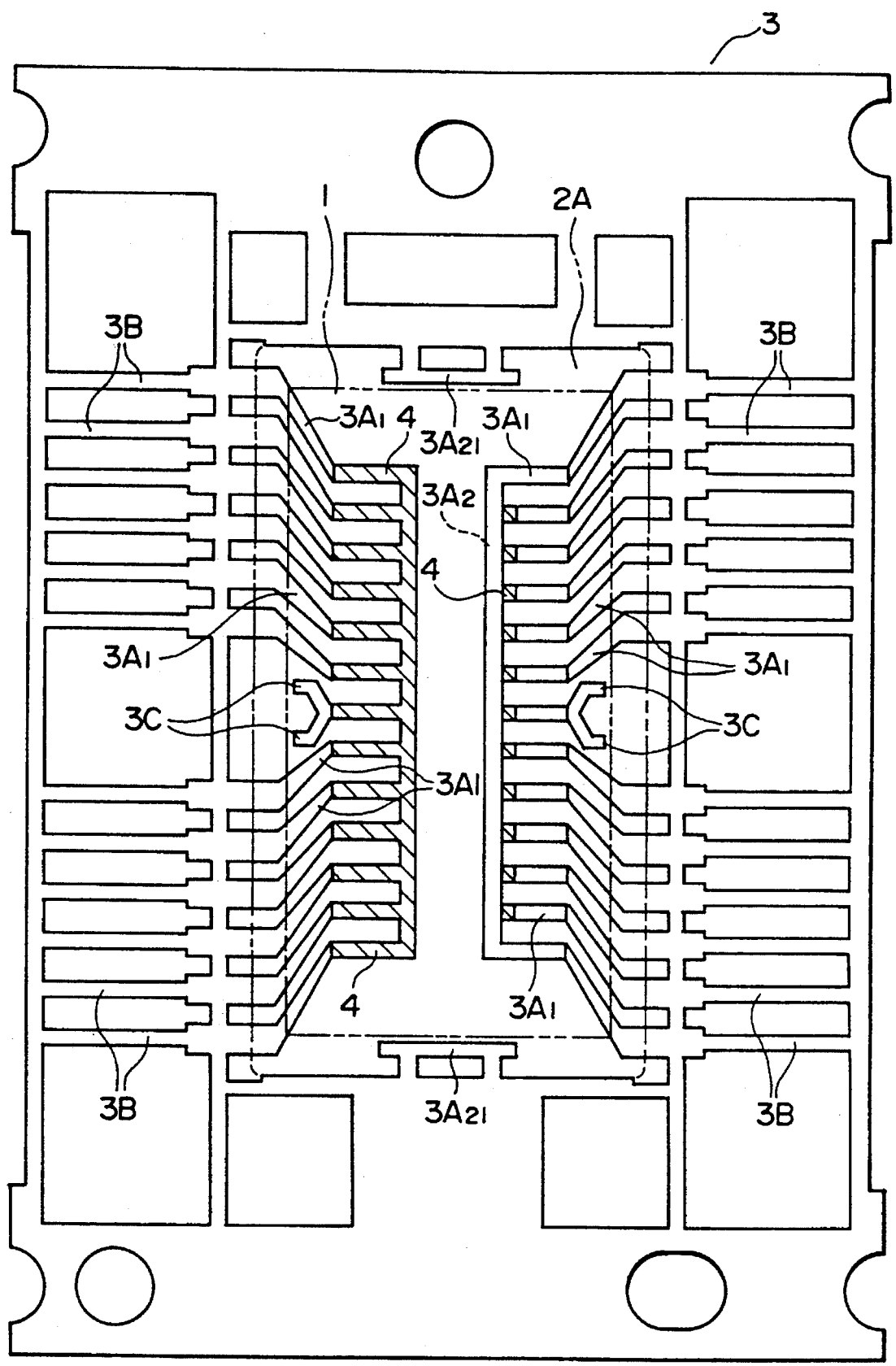
FIG. 8 is an exploded assembly view showing the relation between the semiconductor chip, an insulating film and a lead frame shown in FIG. 4.

The lead frame of this embodiment includes 20 signal inner lead portions 3A$_1$ and 4 common inner lead portions 3A$_2$ formed integrally with two inner bars 3A$_2$ as shown in FIGS. 4 and 8 (overall plan view of the lead frame).

The dummy leads 3C which are not for taking out the signals are disposed at the positions of the common inner lead bars 3A$_2$ corresponding to the center of the major side portions of the rectangular shape of the DRAM chip 1.

The signal inner lead portions 3A$_1$, the inner leads formed integrally with the common inner bars and the dummy leads 3C are disposed substantially equidistantly, respectively.

Because the inner lead portions 3A are disposed substantially equidistantly as described above, a particularly large space is not defined, so that the occurrence of voids on the bonding surface between the main surface of the chip 1 and the insulating film 4 can be prevented.

This embodiment uses the comb-shaped insulating film 4 as shown in FIG. 8, and can therefore prevent the occurrence of the voids that may otherwise occur between the insulating film between the adjacent inner lead portions, and the chip. The main surface of the chip 1, the insulating film 4 and the inner lead portions 3A are bonded by the adhesive layer.

In this embodiment, the comb-shaped insulating base film and the inner lead portions 3A are positioned and bonded in advance before the main surface of the chip 1 and the insulating film 4 are bonded, as shown in FIG. 8. Alternately, the rectangular insulating base film and the inner lead portions 3A may be bonded in advance by the adhesive layer and may be cut to the comb-shaped insulating film 4.

The sealing resin support leads 3A$_{21}$ for supporting the resin sealing type package itself lest it falls are so disposed as to be positioned on the minor side portions of the DRAM chip 1. Positioning of the chip 1 when the chip 1 is bonded to the inner lead portions 3A becomes easy by the use of the sealing resin support leads 3A$_2$ as a positioning index.

Next, the method of bonding and fixing the semiconductor chip 1 to the lead frame 3 by the adhesive layer through the insulating film 4 will be explained.

In FIG. 8, the lead frame 3 and the comb-shaped insulating film 4 are substantially symmetric. Since the comb-shaped insulating film 4 and the inner lead portions 3A formed on the former cannot be depicted in FIG. 8, the drawing shows the state where the inner lead portions and the inner bars of the left half are removed.

First of all, the insulating film 4 is in advance bonded by the adhesive layer to the portions corresponding to the inner lead portions 3A, the common inner bars 3A$_2$, the sealing resin support leads 3A$_{21}$ and the dummy leads 3C, respectively, as shown in FIG. 8. After this insulating film 4 is positioned at a predetermined position on the main surface of the chip or at a predetermined position of a stress absorption film 20 if it is disposed on the main surface, the side of the lead frame on the insulating film 4 side is bonded and fixed to the stress absorption film 20 by the adhesive layer. The stress absorption film 20 need not always exist but if it is disposed, the occurrence of cracks of the chip 1 and package 2 can be effectively prevented as will be described elsewhere.

Figure 9:
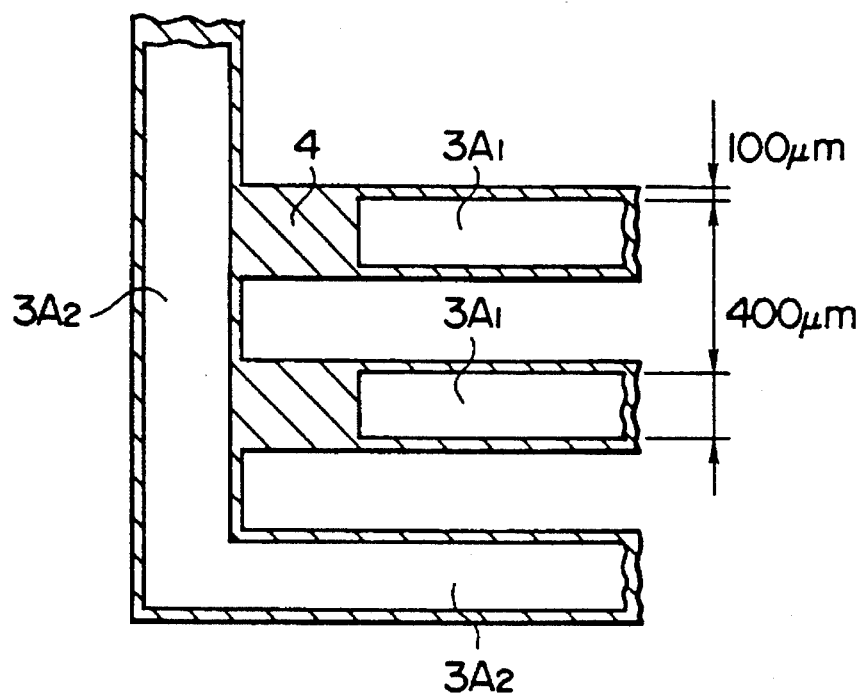
FIG. 9 is a partial plan view showing the dimensional relation between the insulating film and the lead frame shown in FIG. 4.

The comb-shaped insulating tape 4 is bonded to the lead frame 3 by the adhesive layer as shown in FIG. 9. The comb-shaped insulating film 4 somewhat protrudes from the common inner bars 3A$_2$ and from the inner lead portions 3A. In other words, the insulating film 4 has such an area as to provide a peripheral portion (protruding portion) not covered with the inner lead portions 3A$_1$ (and by the inner bars 3A$_2$) so as to increase the bonding power of the insulating film to the packaging material (sealing resin) or/and to the chip 1. The protruding dimension is substantially 10 to 200 μm. A practical dimension is about 100 μm. At this time, the dimensions of the inner lead portions 3A$_1$ and inner bars 3A$_2$ are about 400 μm. If the protruding dimension is by far greater than 200 μm, voids will develop between the insulating film 4 and the chip 1 or the stress absorption film 20. If it is less than 10 μm, on the other hand, peel of the sealing resin will occur from the side surfaces of the inner lead portions 3A$_1$ and inner bars 3A$_2$ and from the side surface of the insulating film 4.

Figure 10:
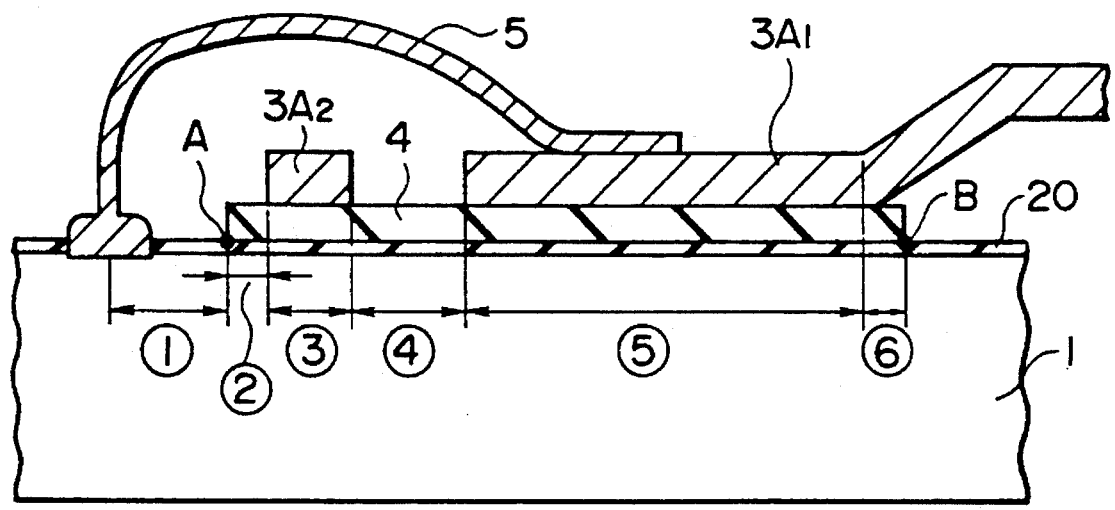
FIG. 10 is a partial sectional view showing the position relation between the bonding wire, insulating tape and lead frame shown in FIG. 4.

As shown in FIG. 10, the dimension of the comb-shaped insulating film 4 in the direction of the comb-teeth or fingers is the length from the point A at which it somewhat protrudes outward from the common inner lead portion 3A$_2$ to the point B at which it somewhat protrudes from the bonding end portion of the signal inner lead portions 3A$_1$ and the chip 1. As shown in FIG. 10, the dimension ① at which short-circuit does not occur even when the adhesive protrudes is 300 to 2,000 μm (practical dimension: 700 μm), the dimension ② of the insulating film 4 on the common inner bar 3A$_2$ side is 10 to 200 μm (practical dimension: 100 μm), the width ③ of the common inner bar 3A$_2$ necessary for wire bonding is 200 to 600 μm (practical dimension: 400 μm), the dimension ④ of the leak space between the inner lead portions is 100 to 500 μm (practical dimension: 300 μm), the necessary dimension ⑤ for wire bonding area down-set is 200 to 1,000 μm (practical dimension: 500 μm) and the protruding dimension ⑥ of the insulating film 4 on the signal inner lead portion 3A$_1$ side is 10 to 200 μm (practical dimension: 100 μm). The width of the comb-shaped insulating film 4 in the direction of the comb-teeth or fingers varies with the kind of semiconductor devices, but is preferably as small (fine) as possible in order to reduce the stress.

When the insulating film 4 is so disposed as to somewhat protrude from the inner lead portion 3A as described above, the development and progress of peel between the sealing resin and other members can be prevented because adherence between the sealing resin and the adhesive is strong. The occurrence of cracks at the time of the temperature cycle can also be avoided. Since the occurrence of the voids inside the small space between the inner lead portions and the chip 1 can be prevented, reliability of the semiconductor devices can be improved.

Figure 11:
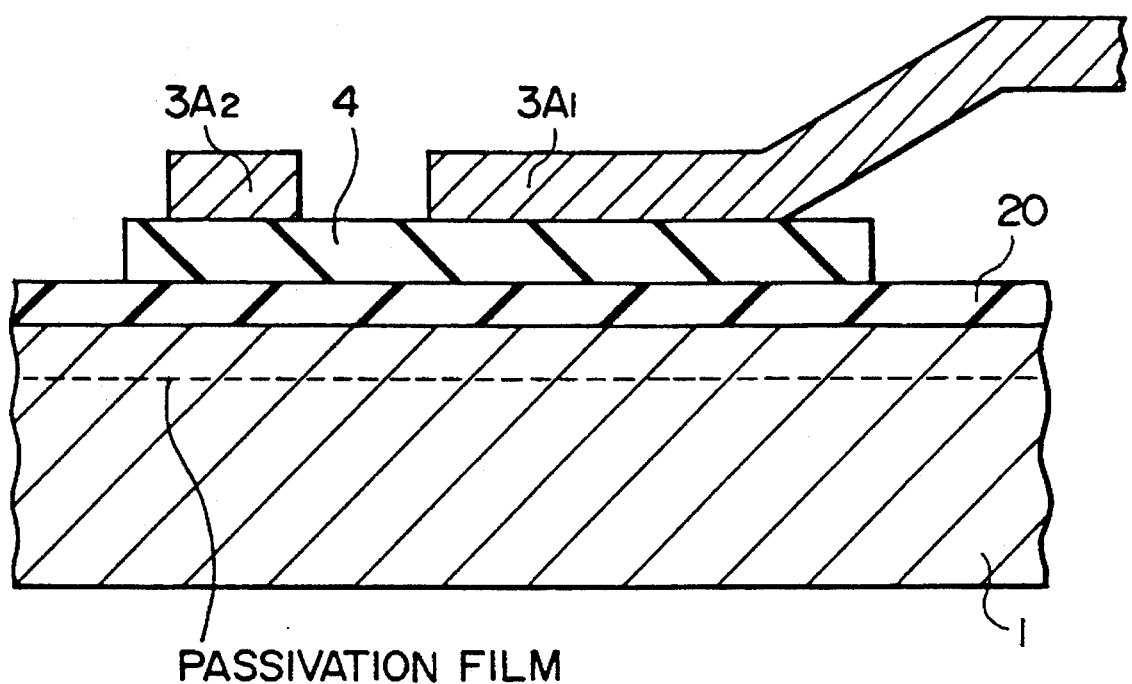
FIG. 11 is a partial enlarged view of FIG. 10.

As shown in FIG. 11, a stress absorption film 20 made of a polyimide resin, for example, is disposed on a passivation film (PSiN, etc.) on the main surface of the chip 1 and the insulating film 4 is disposed on this stress absorption film 20. This stress absorption film 20 is about 10 μm thick, for example. The thermal expansion coefficient of the silicon wafer of the chip 1 is $3\times10^{-6}$/°C. and that of the polyimide type resin of the insulating film 4 is 10 to $70\times10^{-6}$/°C. The thermal expansion coefficient of the stress absorption layer is therefore 10 to $70\times10^{-6}$/°C. when it uses the polyimide resin.

The stress absorption film 20 is preferably made of a material having a thermal expansion coefficient between the thermal expansion coefficient of the chip 1 and that of the insulating film 4. The stress absorption film may have a tensile strength of at least 120 MPa.

The following effects can be obtained when the structure explained with reference to FIG. 11 is employed.

① The stress absorption film 20 absorbs the stress resulting from the difference of thermal expansion coefficients between the chip 1 and the insulating film 4. Therefore, breakage of the surface of the chip 1 can be prevented. If this stress absorption film 20 does not exist, for example, the difference of the thermal stress between the chip 1 and the insulating film 4 applies the tensile stress to the passivation film below the end portions of the insulating film 4 and cracks develop in the integrated circuit portion on the chip 1. If this stress absorption film 20 exists, however, it generates the compressive stress on the surface of the passivation film and hence, the occurrence of the cracks on the surface of the chip 1 can be prevented.

② The breakage of the circuit by the filler contained in the sealing resin can be prevented.

③ Alpha-rays from outside can be shielded (or in other words, the soft error can be prevented).

Figure 12:
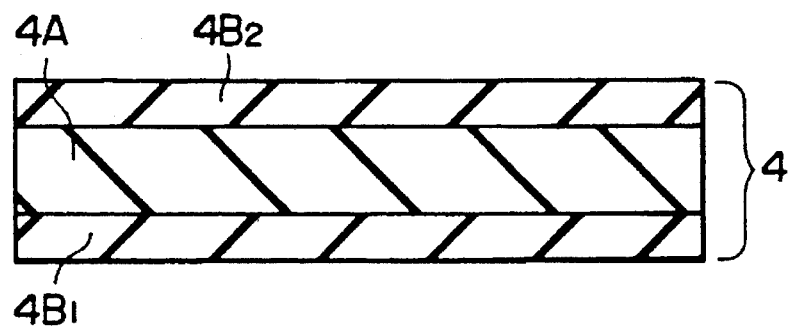
FIG. 12 is an explanatory view useful for explaining a protective film disposed on a main surface of a semiconductor chip according to the present invention.

As shown in FIG. 12, the insulating film 4 comprises an about 50 μm-thick insulating base film 4A made of a polyimide resin, for example, and about 25 μm-thick adhesive layers $4B_1$, $4B_2$ deposited to both surfaces of the base film 4A. Though the adhesive layers $4B_1$, $4B_2$ are preferably made of the polyimide resin, other known adhesives may also be used. The thickness of this insulating film 4 is substantially within the range of 80 to 200 μm. If the thickness is by far greater than 200 μm, the stress due to the temperature cycle becomes so great that cracks occur in the sealing resin. If it is by far smaller than 20 μm, the electric capacity becomes great between the chip and the lead (by far greater than 1.2 pF per lead, for example) and becomes a noise source. The influences on the chip 1 become also great and in the worst case, cracks develop. Therefore, the thickness of the insulating film 4 should be kept within the range described above.

As can be understood from the explanation given above, the insulating film 4 of this embodiment which electrically insulates the inner lead portions 3A comprising the common inner bars $3A_2$ and a plurality of signal inner lead portions $3A_1$ and the chip 1 employ the structure in which they protrude somewhat from the common inner lead bars $3A_2$ and from the signal inner lead portions $3A_1$. Accordingly, strong adherence between the sealing resin and the adhesive prevents the occurrence and progress of the peel between the sealing resin and other members and the occurrence of cracks during the temperature cycles can be avoided.

Since the occurrence of the voids in the small space between the inner lead portions 3A and the chip 1 can be prevented, reliability of the semiconductor device can be improved.

Although the present invention has thus been described definitely with reference to some preferred embodiments, it is not particularly limited thereto but can naturally be changed or modified in various ways without departing from the scope thereof.

We claim:

1. A packaged semiconductor device comprising:

a semiconductor chip having a rectangularly shaped main surface in which an electronic device is formed;

a stress absorption film formed on said main surface of said semiconductor chip for absorbing stress which may be produced in the packaged semiconductor device when subjected to variations of an ambient temperature, said stress absorption film having a tensile strength of at least 120 MPa;

an electrically insulating film provided on said stress absorption film and having an electrically insulating base film, said insulating film being comb-shaped to include a bar portion extending in a first direction substantially parallel with a pair of parallel sides of said main surface of said chip and a plurality of substantially parallel finger portions extending from said bar portion in a second direction substantially perpendicular to said bar portion, said stress absorption film having a thermal expansion coefficient not smaller than that of said semiconductor chip and not larger than that of said electrically insulating film;

a common inner lead bar formed on said bar portion of the insulating film;

a plurality of leads each including an inner lead portion and an outer lead portion continuing from said inner lead portion, first parts of the inner lead portions of the leads being respectively formed on said finger portions of the insulating film; and a packaging material with which said semiconductor chip, said electrically insulating film, said common inner lead bar and said inner lead portions are sealed, said outer lead portions protruding from said packaging material, wherein said bar portion of the insulating film has an area large enough to provide a first insulating peripheral area portion not covered by said common inner lead bar, said first insulating peripheral area portion extending around said common inner lead bar, wherein each of said finger portions of the insulating film has another area large enough to provide a second insulating peripheral area portion not covered by said first part of its associated inner lead portion, said second insulating peripheral area portion extending around said first part of its associated inner lead portion, and wherein each of said first and second insulating peripheral area portions have widths set to increase adherence of said comb-shaped insulating film to said packaging material and to said semiconductor chip to prevent cracks in said packaging material adjacent to said common inner lead bar and said plurality of leads.

2. A packaged semiconductor device according to claim 1, in which both of said stress absorption film and said electrically insulating film are made of a polyimide resin.

3. A packaged semiconductor device according to claim 1, in which said stress absorption film serves to produce compressive stress to said chip.

4. A packaged semiconductor device according to claim 1, in which said width of said first and second peripheral area portions of said electrically insulating film is substantially 100μm.

5. A packaged semiconductor device according to claim 1, further comprising first and second adhesive layers provided on opposite first and second surfaces of said electrically insulating base film, respectively, said first adhesive layer being sandwiched between said stress absorption film and said electrically insulating base film and said second adhesive layer being sandwiched between said common inner lead bar and said electrically insulating base film and between said first parts of said inner lead portions and said base film.

6. A packaged semiconductor device comprising:

a semiconductor chip having a rectangularly shaped main surface in which an electronic device is formed;

a stress absorption film formed on said main surface of said semiconductor chip for absorbing stress which may be produced in the packaged semiconductor device when subjected to variations of an ambient temperature, said stress absorption film having a thickness of substantially 10 μm;

an electrically insulating film provided on said stress absorption film and having an electrically insulating base film, said insulating film being comb-shaped to include a bar portion extending in a first direction substantially parallel with a pair of parallel sides of said main surfaces of said chip and a plurality of substantially parallel finger portions extending from said bar portion in a second direction substantially perpendicular to said bar portion, said stress absorption film having a thermal expansion coefficient not smaller than that of said semiconductor chip and not larger than that of said electrically insulating film;

a common inner lead bar formed on said bar portion of the insulating film;

a plurality of leads each including an inner lead portion and an outer lead portion continuing from said inner lead portion, first parts of the inner lead portions of the leads being respectively formed on said finger portions of the insulating film; and a packaging material with which said semiconductor chip, said electrically insulating film, said common inner lead bar and said inner lead portions are sealed, said outer lead portions protruding from said packaging material, wherein said bar portion of the insulating film has an area large enough to provide a first insulating peripheral area portion not covered by said common inner lead bar, said first insulating peripheral area portion extending around said common inner lead bar, wherein each of said finger portions of the insulating film has another area large enough to provide a second insulating peripheral area portion not covered by said first part of its associated inner lead portion, said second insulating peripheral area portion extending around said first part of its associated inner lead portion, and wherein each of said first and second insulating peripheral area portions have widths set to increase adherence of said comb-shaped insulating film to said packaging material and to said semiconductor chip to prevent cracks in said packaging material adjacent to said common inner lead bar and said plurality of leads.

* * * * *